Jan. 20, 1970 J. J. L. WEAVER ET AL 3,491,271
HOUSINGS FOR ELECTRICALLY CONDUCTIVE HEAT-DISSIPATING DEVICES
Original Filed June 29, 1966
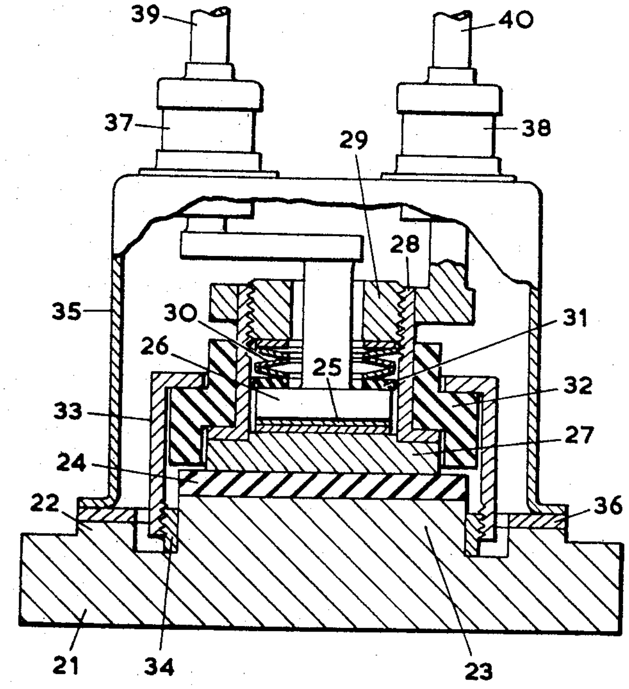

United States Patent Office 3,491,271
Patented Jan. 20, 1970

3,491,271

HOUSING FOR ELECTRICALLY CONDUCTIVE HEAT-DISSIPATING DEVICES

John James Lawrence Weaver and Arnaud Michael Eccles, Stafford, England, assignors to The English Electric Company Limited, London, England, a British company Original application June 29, 1966, Ser. No. 561,543. Divided and this application Apr. 21, 1969, Ser. No. 817,724

Claims priority, application Great Britain, July 1, 1965, 27,901/65

Int. Cl. H01l 3/00, 5/00, 9/00

U.S. Cl. 317—234 2 Claims

ABSTRACT OF THE DISCLOSURE

This invention relates to a housing for a semi-conductor diode, thyristor or the like and includes a clamp for sandwiching a beryllia plate between this semi-conductor device and a heat sink, the whole being enclosed within a common envelope secured to the heat sink for hermetically sealing both the beryllia plate and the semi-conductor device. The clamp is effective to hold this device under compression contact, e.g. through Belleville-type spring washers.

This application is a division of our co-pending application Ser. No. 561,543 filed on June 29, 1966, and relates to housings for electrically conductive heat-dissipating devices, and particularly, but not exclusively, relates to such assemblies incorporating semi-conductor diodes or thyristors.

From one aspect, the present invention consists in a semi-conductor assembly comprising:

An electrically conductive heat sink;

A beryllia member having high thermal conductivity and high electrical resistivity mounted on the heat sink;

A semi-conductor device mounted on the said member including a semi-conductor element having at least one p-type zone and at least one n-type zone with a p-n junction therebetween; and Conductive contacts for each zone on opposite sides of said device, one contact lying between the said member and the said device and overlapping said device, and the other surmounting said device;

Clamp means surmounting the device, the contacts and the member and attached to the heat sink, said clamp comprising:

A first capped part extending around said member and screw-threaded to the heat sink;

A second capped part mounted directly on said one contact and extending around the semi-conductor device;

An electrically insulating member disposed between the first and second parts;

Resilient means interposed between said second capped part and said other conductive contact being held thereby under a compressive stress, whereby both contacts and said member are held in compressive relation with the heat sink;

A common envelope secured to the heat sink hermetically sealing both the device and the said member; and Two leads connected to the respective protruding portions of said contacts and extending through said envelope.

The beryllia member may be soldered to its adjacent surfaces and the first capped part may embody a number of spiral slots in its walls so as to impart to it a degree of resilience.

By mounting the semi-conductor element and the beryllia insulator by the compression contact technique in accordance with this invention, stressing problems which normally result from thermal expansion do not arise, and the toxic contamination hazard associated with the use of beryllia is reduced by employing the same hermetic encapsulation for both the beryllia and the semi-conductor element, with the result that the assembly can be more easily handled.

Furthermore, such assemblies readily enable a number of semi-conductor devices having different individual potentials to be mounted on a common heat sink, the beryllia pads having a thermal conductivity similar to that of aluminum and a resistivity similar to that of a porcelain.

In order that the invention can be fully understood one embodiment of the invention will now be described, by way of example, with reference to the accompanying drawing which shows one form of assembly in which a semi-conductor diode is held in compression contact with a heat sink.

Referring now to the drawing, the assembly comprises a thick copper base 21, and this base has upstanding therefrom an annular outer portion 22 and a circular inner portion 23. The upper face of this latter portion is lapped and engages with a similarly lapped beryllia pad 24. A semi-conductor diode 25 is sandwiched between its two contacts 26 and 27, the contact 27 engaging the upper face of the beryllia pad 24 and the contacts 26 being clamped down within a sub-assembly. In particular, this comprises an outer steel cylinder 28 which has a stepped portion at its lower end secured to the contact 27, and is internally screw-threaded at its upper end to accommodate an externally threaded nut 29 which is rotatable to compress a number of Belleville-type spring washers 30 onto the contact 26 through the intermediary of an insulating washer 31.

In turn, the stepped portion of the cylinder 28 is embraced by an alumina ring 32 which itself is firmly mounted on the copper base 21 by a cylindrical steel member 33, this member being screwed onto a steel ring 34 secured to the inner portion 23 of the base. In order to take up any misalignment, thermal expansion and mechanical shock, the member 33 may conveniently have a number of spiral slots formed in its walls so as to impart to it a degree of resilience.

This assembly is hermetically sealed within a dome-shaped steel cap 35 which is secured to a steel ring 36 brazed or otherwise secured to the outer portion 22 of the base, the cap 35 carrying in addition two insulating seals 37, 38 through which extend two connecting leads 39, 40 respectively, for the contacts 26 and 27.

It is to be understood that in each of these arrangements modifications may be made without departing from the scope of this invention. For example, the side walls of the dome-shaped cap may conveniently include an alumina insert which spaces apart the upper and lower parts of the cap. Furthermore, semi-conductor elements other than diodes may be employed, e.g. thyristors, and the or each beryllia pad may be metallised and soldered to one or both of the surfaces between which it is sandwiched in order to still further improve the thermal contact.

We claim:

1. A semiconductor assembly comprising:

an electrically conductive heat sink, a beryllia member having high thermal conductivity and high electrical resistivity mounted on the heat sink, a semiconductor device mounted on the said member including a semiconductor element having at least one p-type zone and at least one n-type zone with a p-n junction therebetween, and conductive contacts for each zone on opposite sides of said device, one contact lying between the said member and the said device and overlapping said device, and the other surmounting said device, clamp means surmounting the device, the contacts and the member and attached to the heat sink, said clamp comprising, a first capped part extending around said member and screw-threaded to the heat sink, a second capped part mounted directly on said one contact and extending around the semiconductor device, an electrically insulating member disposed between the first and second parts, resilient means interposed between said second capped part and said other conductive contact being held thereby under a compressive stress, whereby both contacts and said member are held in compressive relation with the heat sink, a common envelope secured to the heat sink hermetically sealing both the device and the said member, and two leads connected to the respective protruding portions of said contacts and extending through said envelope.

2. A semiconductor assembly according to claim 1, wherein the beryllia member is soldered to its adjacent surfaces on the heat sink and the semi-conductor device.

References Cited

UNITED STATES PATENTS

| | | | |
|---|---|---|---|
| 2,862,159 | 11/1958 | Walworth | 317—234 |
| 2,887,628 | 5/1959 | Zierdt | 317—234 |
| 2,907,935 | 10/1959 | Nagorsen | 317—234 |
| 3,252,060 | 5/1966 | Marino et al. | 317—234 |

FOREIGN PATENTS

| | | |
|---|---|---|
| 1,381,184 | 10/1964 | France. |
| 1,000,023 | 8/1965 | Great Britain. |

JOHN W. HUCKERT, Primary Examiner

J. R. SHEWMAKER, Assistant Examiner

U.S. Cl. X.R.

174—52; 317—235